(12) United States Patent
Asai et al.

(10) Patent No.: US 10,680,012 B2
(45) Date of Patent: Jun. 9, 2020

(54) SEMICONDUCTOR DEVICE

(71) Applicant: TOSHIBA MEMORY CORPORATION, Minato-ku (JP)

(72) Inventors: Shihoko Asai, Yokkaichi (JP); Hisakazu Matsumori, Yokkaichi (JP); Yasuko Takechi, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 16/351,589

(22) Filed: Mar. 13, 2019

(65) Prior Publication Data

US 2020/0091184 A1 Mar. 19, 2020

(30) Foreign Application Priority Data

Sep. 18, 2018 (JP) .................................. 2018-174069

(51) Int. Cl.
*H01L 27/11582* (2017.01)
*H01L 27/11573* (2017.01)
(Continued)

(52) U.S. Cl.
CPC ...... *H01L 27/11582* (2013.01); *H01L 23/585* (2013.01); *H01L 27/11568* (2013.01);
(Continued)

(58) Field of Classification Search
CPC ......... H01L 27/11582; H01L 27/11573; H01L 27/11575; H01L 27/11568; H01L 23/585; H01L 29/1037; H01L 21/0217; H01L 21/0273; H01L 21/31144; H01L 21/02595; H01L 21/02636; H01L 21/02532; H01L 21/02164; H01L 21/31116; H01L 21/31111
USPC .................. 257/324, 368, 314, 298, 532, 57, 257/E27.046, E27.081, E27.084, E29.309, 257/E29.342, E21.008, E21.09, E21.19,
(Continued)

(56) References Cited

U.S. PATENT DOCUMENTS 8,933,541 B2 1/2015 Kato et al.
9,196,731 B2 11/2015 Kume et al.
(Continued)

FOREIGN PATENT DOCUMENTS

JP 2015-050390 3/2015
JP 5679626 3/2015

*Primary Examiner* — Dao H Nguyen
(74) *Attorney, Agent, or Firm* — Oblon, McClelland, Maier & Neustadt, L.L.P.

(57) ABSTRACT

According to one embodiment, there is provided a semiconductor device including a stacked body, a semiconductor columnar member, an insulating film, and a structure. The stacked body is disposed above a semiconductor substrate. In the stacked body, a conductive film and an insulating layer are alternately disposed in a stacking direction. The semiconductor columnar member penetrates the stacked body in the stacking direction. The insulating film surrounds the semiconductor columnar member and penetrates the stacked body in the stacking direction. The structure is disposed in a peripheral circuit region on the semiconductor substrate. The peripheral circuit region is a region including a plurality of circuit blocks. The structure has a plate-shaped portion extending at least between the plurality of circuit blocks.

20 Claims, 8 Drawing Sheets

(51) Int. Cl.
*H01L 27/11568* (2017.01)
*H01L 23/58* (2006.01)
*H01L 27/11575* (2017.01)
*H01L 29/10* (2006.01)
*H01L 21/311* (2006.01)
*H01L 21/02* (2006.01)
*H01L 21/027* (2006.01)

(52) U.S. Cl.
CPC .. *H01L 27/11573* (2013.01); *H01L 27/11575* (2013.01); *H01L 29/1037* (2013.01); *H01L 21/0217* (2013.01); *H01L 21/0273* (2013.01); *H01L 21/02164* (2013.01); *H01L 21/02532* (2013.01); *H01L 21/02595* (2013.01); *H01L 21/02636* (2013.01); *H01L 21/31111* (2013.01); *H01L 21/31116* (2013.01); *H01L 21/31144* (2013.01)

(58) Field of Classification Search
USPC ....... 257/E21.21, E21.41, E21.645; 365/148, 365/185.17, 185.23, 51; 438/16, 586, 438/585, 478
See application file for complete search history.

(56) References Cited

U.S. PATENT DOCUMENTS

| | | | |
|---|---|---|---|
| 2012/0161281 A1* | 6/2012 | Hasunuma | H01L 27/0207 257/532 |
| 2013/0322178 A1* | 12/2013 | He | G11C 16/08 365/185.17 |
| 2014/0192598 A1* | 7/2014 | He | G11C 16/0483 365/185.17 |
| 2014/0284674 A1* | 9/2014 | Iwai | H01L 27/1157 257/298 |
| 2017/0062624 A1* | 3/2017 | Makiyama | H01L 29/7838 |
| 2017/0221919 A1 | 8/2017 | Chung | |
| 2017/0243908 A1 | 8/2017 | Chien et al. | |
| 2020/0013795 A1* | 1/2020 | Dunga | G11C 7/1048 |

* cited by examiner

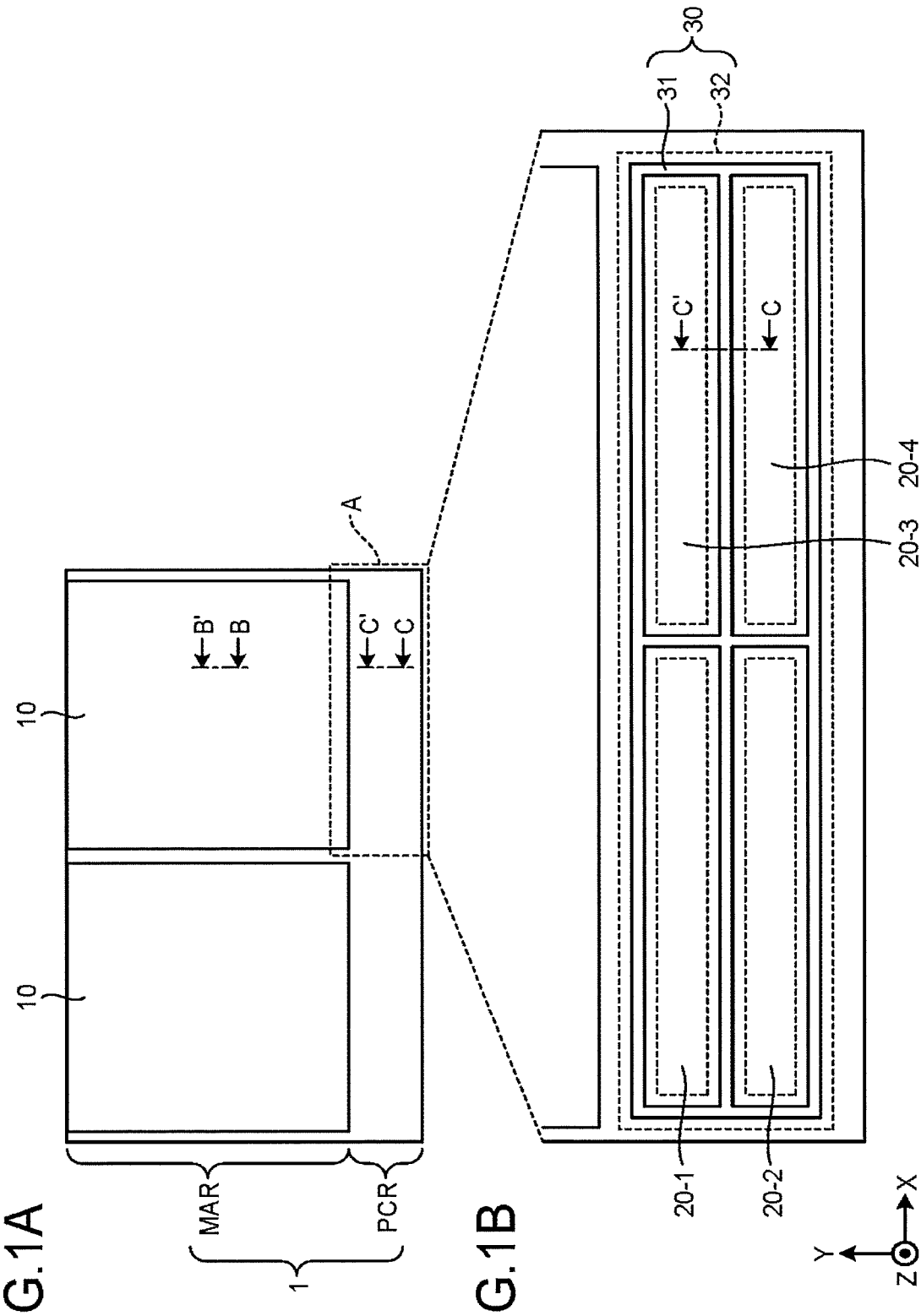

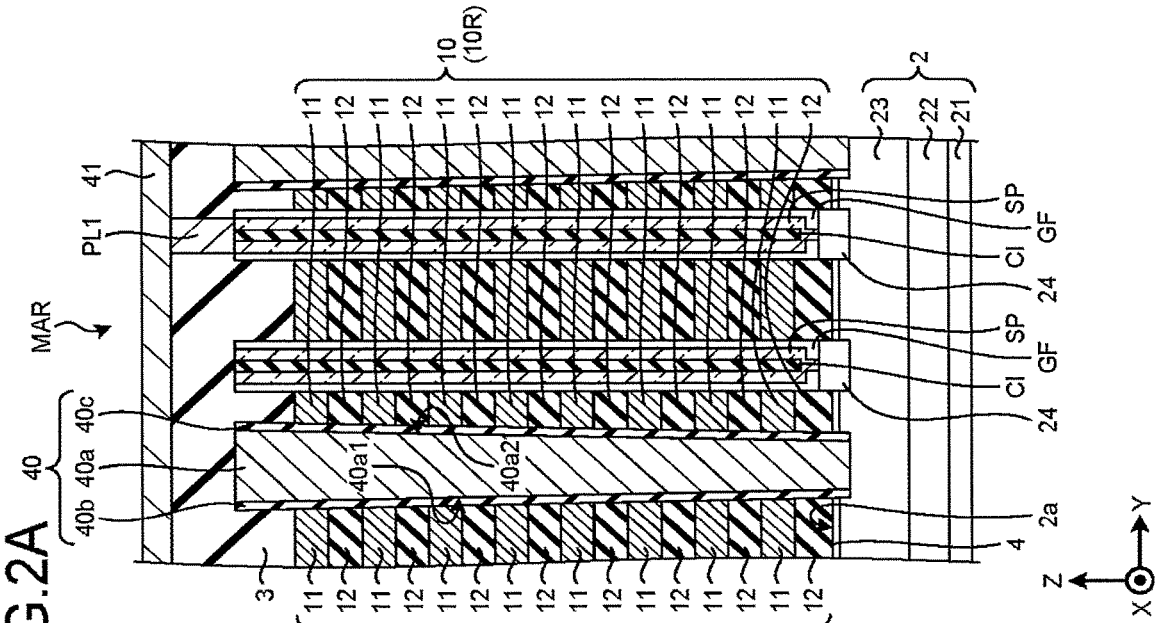
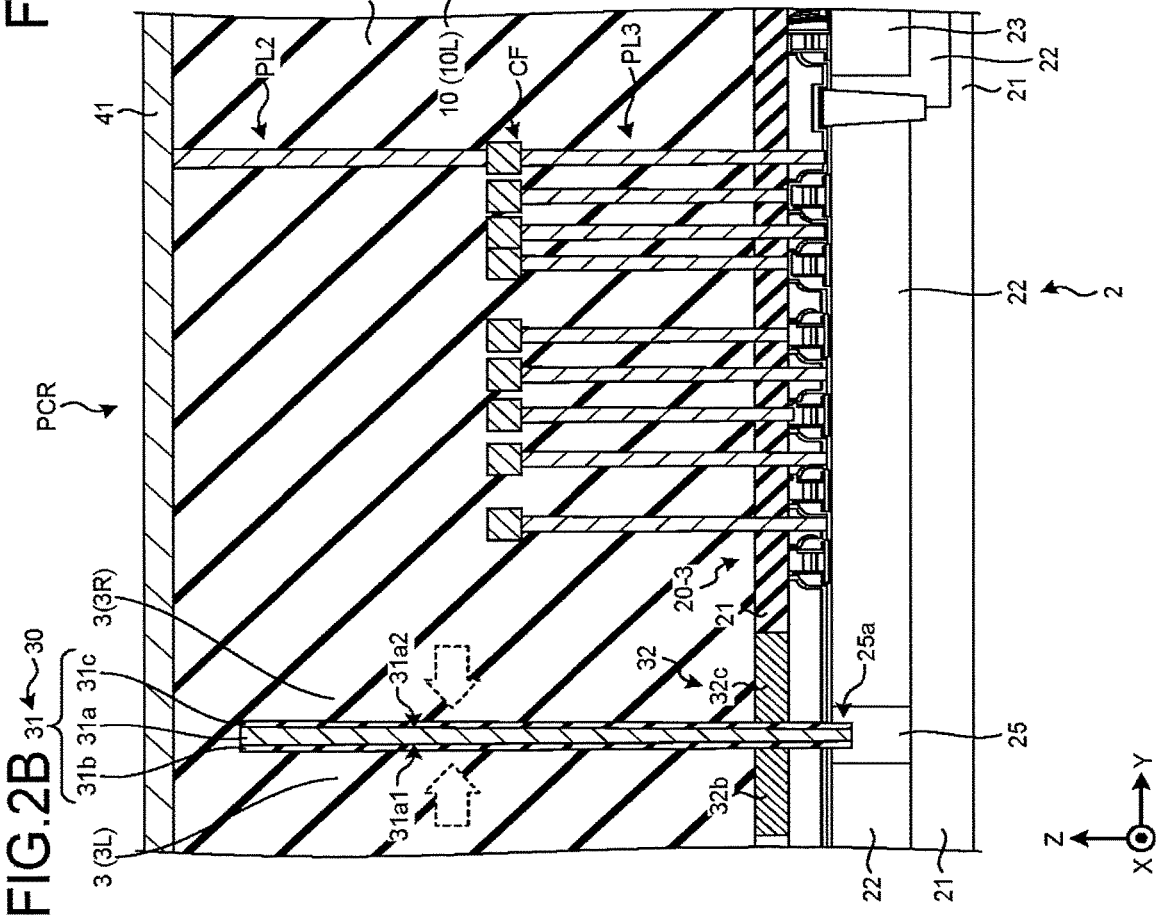

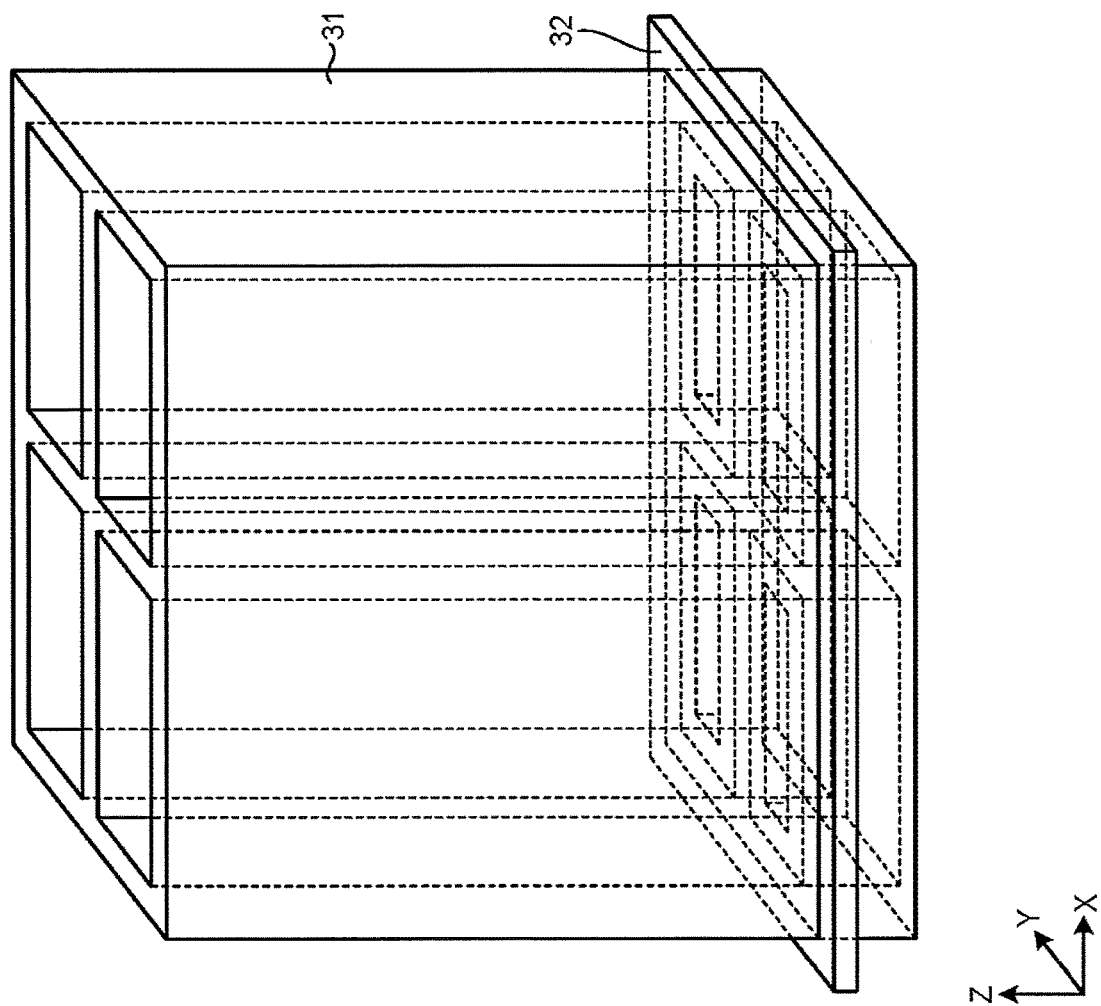

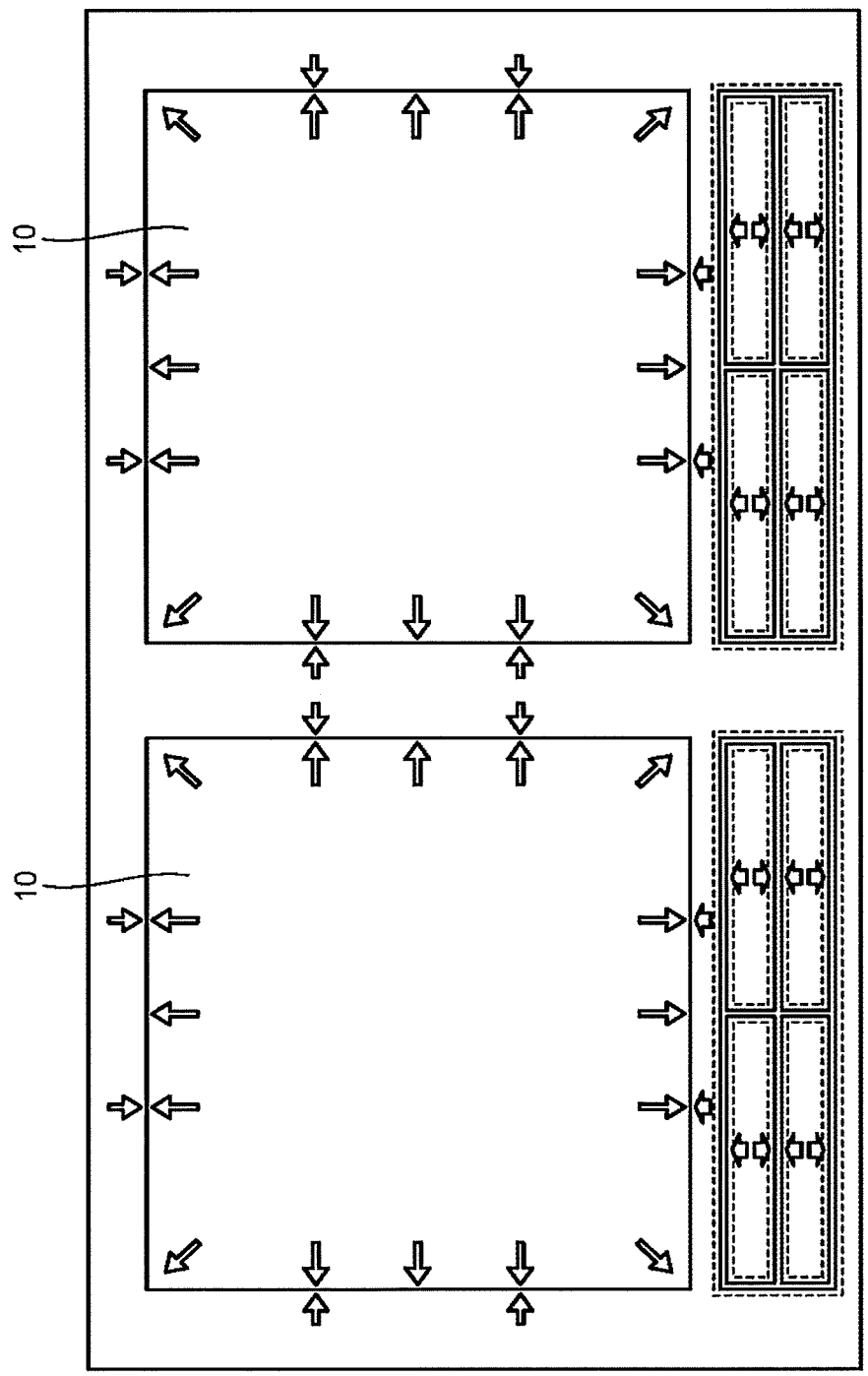

SEMICONDUCTOR DEVICE

CROSS-REFERENCE TO RELATED APPLICATIONS

This application is based upon and claims the benefit of priority from Japanese Patent Application No. 2018-174069, filed on Sep. 18, 2018; the entire contents of which are incorporated herein by reference.

FIELD

Embodiments described herein relate generally to a semiconductor device.

BACKGROUND

A semiconductor device may include a stacked body and a semiconductor columnar member that penetrates the stacked body. The stacked body includes a conductive film and an insulating film alternately disposed. It is desirable to increase the number of layers of the stacked body to achieve higher integration of the semiconductor device.

BRIEF DESCRIPTION OF THE DRAWINGS

FIGS. 1A and 1B are plan views illustrating a configuration of a semiconductor device according to an embodiment;

FIGS. 2A and 2B are cross-sectional views illustrating the configuration of the semiconductor device according to the embodiment;

FIG. 3 is a perspective view illustrating a configuration of a structure in the embodiment;

FIG. 4 is a plan view illustrating stress distribution in the semiconductor device according to the embodiment;

DETAILED DESCRIPTION

Figure 5A:
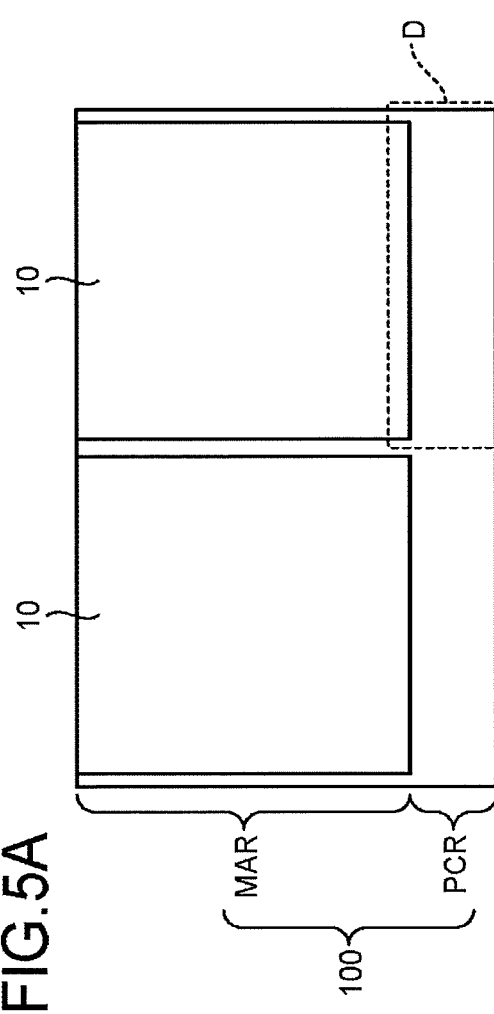
FIGS. 5A and 5B are plan views illustrating a configuration of a semiconductor device according to Modified Example of the embodiment.

In general, according to one embodiment, there is provided a semiconductor device including a stacked body, a semiconductor columnar member, an insulating film, and a structure. The stacked body is disposed above a semiconductor substrate. In the stacked body, a conductive film and an insulating layer are alternately disposed in a stacking direction. The semiconductor columnar member penetrates the stacked body in the stacking direction. The insulating film surrounds the semiconductor columnar member and penetrates the stacked body in the stacking direction. The structure is disposed in a peripheral circuit region on the semiconductor substrate. The peripheral circuit region is a region including a plurality of circuit blocks. The structure has a plate-shaped portion extending at least between the plurality of circuit blocks.

Exemplary embodiments of a semiconductor device will be explained below in detail with reference to the accompanying drawings. The present invention is not limited to the following embodiments.

Embodiment

In some cases, in a semiconductor device, a stacked body in which a conductive film and an insulating layer are alternately stacked is penetrated by a semiconductor columnar member and a gate insulating film covering a side surface of the semiconductor columnar member to form a three-dimensional memory. Since this semiconductor device can increase the storage capacity by increasing the number of stacked layers, it is possible to reduce the necessity to use a more advanced patterning technique and to easily reduce the cost per bit.

In this three-dimensional memory, a portion where the conductive layers and the semiconductor columnar members intersect each other is configured to function as a memory cell, and a memory cell array region in which a plurality of the memory cells are three-dimensionally disposed is configured. An interlayer insulating film is disposed around the stacked body. Since the material of the stacked body is different from that of the interlayer insulating film, the stacked body is likely to receive a stress from the interlayer insulating film due to a difference in the thermal expansion coefficient and shrinkage coefficient of the material during the manufacturing and/or after the manufacturing.

For example, in a manufacturing process of a semiconductor device, an insulating layer (for example, a silicon oxide film) and a sacrificial film (for example, a silicon nitride film) are alternately deposited plural times to form a stacked structure, and an interlayer insulating film is formed around the stacked structure. A resist pattern with openings at the formation positions of the semiconductor columnar members is formed on the stacked structure, and anisotropic etching such as reactive ion etching (RIE) is performed by using the resist pattern as a mask to form a memory hole penetrating the stacked structure. Then, a single crystal semiconductor layer (for example, a silicon layer) is formed at the bottom of the memory hole by selective epitaxial growth. An oxide film (for example, a silicon oxide film), a nitride film (for example, a silicon nitride film), and an oxide film (for example, a silicon oxide film) are sequentially deposited on the side and bottom surfaces of the memory hole to form an insulating film, and after the insulating film on the bottom surface of the memory hole is removed, a semiconductor film (for example, a polysilicon film) is deposited to form a semiconductor columnar member. In addition, the core insulating layer may be filled in the memory hole.

Then, a resist pattern having openings at the positions where the slits (separators) are formed is formed on the stacked structure. Anisotropic etching such as reactive ion etching (RIE) is performed using the resist pattern as a mask, and the stacked structure is divided by the slits into a plurality of stacked bodies.

The stacked bodies are likely to thermally shrink, whereas the interlayer insulating film is likely to thermally expand, so that the stacked body is likely to receive a stress from the interlayer insulating film.

Thereafter, the sacrificial film is removed by isotropic etching such as wet etching from each stacked body including the insulating layer and the sacrificial film alternately layered, to form a block film (for example, alumina) on the exposed surface of the gap formed by the removal. A block film is also deposited in the slit. Then, the conductive material is filled in the gap via the slit, forming the stacked body of the conductive film and the insulating layer alternately stacked. In addition, in some cases, the conductive material and the block film deposited in the slit are removed, but an insulating film is formed on the side surface of the slit in a state where the residue of the block film remains on the side surface of the slit, and after that, the conductive material is buried in the slit so that a separator for electrically separating the plurality of stacked bodies is formed.

The stacked bodies are more likely to thermally shrink, whereas the interlayer insulating film is likely to thermally expand. Thus, the stacked bodies tend to be more susceptible to a stress from the interlayer insulating film.

When the stacked body receives a stress from the interlayer insulating film, the contact position between the plug and the conductive film may be moved or the plug and/or the conductive film may be damaged. This may cause electrical disconnection or short-circuiting in the stacked body, resulting in decrease in the yield of the semiconductor device during the manufacturing or a failure of the semiconductor device after the manufacturing. For example, in a semiconductor device, since the interlayer insulating film occupies a larger volume in the peripheral circuit region than the memory cell array region, it is preferable that the stress from the interlayer insulating film in the peripheral circuit region can be reduced.

The semiconductor device of the embodiment is configured to include, in the peripheral circuit region including circuit blocks, the structure having the plate-shaped portion extending between the circuit blocks, so that it is possible to reduce the stress exerted from the interlayer insulating film to the stacked body, to improve the yield of the semiconductor device, and to reduce the malfunction after the manufacturing.

Specifically, the semiconductor device 1 is configured as illustrated in FIGS. 1A, 1B, 2A, and 2B. FIG. 1A is a plan view illustrating a configuration of a semiconductor device 1. FIG. 1B is a plan view illustrating a configuration of a peripheral circuit region and is an enlarged plan view of a portion A in FIG. 1A. FIG. 2A is a cross-sectional view illustrating a configuration of a memory cell array region MAR and illustrates a cross section of the configuration of FIG. 1A taken along the line B'-B. FIG. 2B is a cross-sectional view illustrating a configuration of a peripheral circuit region PCR of the configuration of FIG. 1A or 1B taken along the line C'-C. In FIGS. 1 and 2, a direction perpendicular to a surface 2a of a substrate 2 is defined as a Z direction, and two directions perpendicular to each other in the plane perpendicular to the Z direction are defined as an X direction and a Y direction. In addition, it is assumed that, a stacked body 10 constituting a main part of the semiconductor device 1 is formed on the +Z side of the substrate 2.

As illustrated in FIGS. 1A, 1B, 2A, and 2B, the semiconductor device 1 includes a substrate 2, an interlayer insulating film 3, a plurality of stacked bodies 10, a plurality of gate insulating films GF, a plurality of semiconductor columnar members SP, a plurality of circuit blocks 20-1 to 20-4, a structure 30, and a plurality of separators 40.

For example, as illustrated in FIG. 1A, the semiconductor device 1 includes a memory cell array region MAR and a peripheral circuit region PCR. In FIG. 1A, the two stacked bodies 10 are disposed in the memory cell array region MAR, but the number of the stacked bodies 10 in the memory cell array region MAR is not limited to two.

Each stacked body 10 in the memory cell array region MAR, as illustrated in FIG. 2A, includes the plurality of semiconductor columnar members SP, the plurality of gate insulating films GF, and the plurality of separators 40.

The plurality of stacked bodies 10 is disposed on the substrate 2 via an insulating film 4. In each stacked body 10, the conductive films 11 and the insulating layers 12 are alternately disposed in the stacking direction (Z direction). The substrate 2 may be made of a material containing a semiconductor (for example, silicon) as a main component. The substrate 2 includes an underlying region 21, a first well region 22, and a second well region 23. The first well region 22 is disposed in the underlying region 21 and contains impurities of a first conductivity. The second well region 23 is disposed in the first well region 22 and contains impurities of a second conductivity opposite to the first conductivity. In a case where the first conductivity is N-type, the impurity of the first conductivity may be, for example, phosphorus, or arsenic. In a case where the second conductivity is P-type, the impurity of the second conductivity may be, for example, boron. The conductive film 11 may be made of a material containing a conductive material (for example, tungsten) as a main component. The insulating layer 12 is made of a material containing an insulator (for example, a silicon oxide) as a main component.

As illustrated in FIG. 2A, the semiconductor columnar members SP are arranged in the memory cell array region MAR in the X direction and the Y direction. The semiconductor columnar members SP have a substantially cylindrical shape around, for example, the Z direction and penetrate the stacked body 10 in a direction substantially perpendicular to the surface 2a of the substrate 2, i.e., substantially in the Z direction. Each of the semiconductor columnar members SP may be made of a substantially cylindrical semiconductor member having a bottom and may have a structure in which a core insulating film CI is disposed inside the semiconductor member. The semiconductor columnar member SP may function as a channel region (an active region) in the memory cell.

The gate insulating films GF are arranged in the X direction and the Y direction in the memory cell array region MAR corresponding to the semiconductor columnar members SP. Each of the gate insulating films GF is disposed between the semiconductor columnar member SP and the stacked body 10. Each of the gate insulating films GF has a substantially cylindrical shape around, for example, the Z direction and penetrates the stacked body 10 in a direction substantially perpendicular to the surface 2a of the substrate 2, i.e., substantially in the Z direction. That is, each of the gate insulating films GF surrounds the periphery of the semiconductor columnar member SP when viewed in an XY plane. Each of the gate insulating films GF extends in the Z direction in contact with the side surface of the semiconductor columnar member SP when viewed in a YZ cross section. The gate insulating film GF is configured to have a charge storage capability and has, for example, an ONO three-layer structure (for example, a three-layer structure of a silicon oxide film, a silicon nitride film, and a silicon oxide film). In the memory cell array region MAR, electric charges can be accumulated in a region where the semiconductor columnar member SP and the conductive film 11 intersect each other in the gate insulating film GF. The conductive film 11 can function as a control gate in the memory cell.

In addition, the upper end of the semiconductor columnar member SP is connected to an upper layer interconnection 41 via a plug PL1. The upper layer interconnection 41 extends in the Y direction at a position closer to the +Z side than a +Z side end of the separator 40 and can function as a bit line in the three-dimensional memory. The lower end of the semiconductor columnar member SP is connected to the substrate 2 which can function as a source line in the three-dimensional memory via the semiconductor layer 24. The semiconductor layer 24 may be made of a material containing a semiconductor (for example, silicon) epitaxially grown from the substrate 2 as a main component.

The stacked body 10 includes separators 40 which extend in the X direction and electrically separates or divides the stacked body 10 into a plurality of parts in the Y direction. The portion of the stacked body 10 between the two adjacent separators 40 in the Y direction constitutes a block being a unit of data erasure in, for example, a three-dimensional memory. The separator 40 includes a conductive member 40a and insulating films 40b and 40c. In FIG. 2A, the stacked body 10 on the left side of the separator 40 in the figure is referred to as a stacked body 10L, and the stacked body 10 on the right side is referred to as a stacked body 10R for the sake of convenience. The conductive member 40a has a substantially fin shape extending in the X direction and the Z direction, and the lower end of the conductive member 40a is connected to the substrate 2 to function as a source contact. The conductive member 40a may be made of a material containing a conductive material (for example, tungsten) as a main component. A side surface 40a1 of the conductive member 40a facing the stacked body 10L is covered with the insulating film 40b having a substantially fin shape extending in the X direction and the Z direction. A side surface 40a2 of the conductive member 40a facing the stacked body 10R is covered with the insulating film 40c having a substantially fin shape extending in the X direction and the Z direction. Each of the insulating film 40b and the insulating film 40c may be made of a material containing an insulator (for example, a silicon oxide) as a main component. The residue (containing alumina as a main component, for example) of the block film, which is accumulated on the side surface of the slit as the block film is deposited in the gap formed by removing the sacrificial film from each stacked body 10 as described above, may be also layered on the outer surfaces of the insulating film 40b and the insulating film 40c.

As illustrated in FIG. 1B, a plurality of the circuit blocks 20-1 to 20-4 and the structure 30 are disposed in the peripheral circuit region PCR. The circuit blocks 20-1 to 20-4 are disposed in a matrix when viewed in an XY plane. The circuit blocks 20-1 to 20-4 may include, for example, sense amplifier units in a three-dimensional memory. The structure 30 extends between the circuit blocks 20-1 to 20-4 and extends so as to surround the circuit blocks 20-1 to 20-4. When viewed in an XY plane, the structure 30 extends in a lattice pattern between the circuit blocks 20-1 to 20-4 and extends in a rectangular form so as to surround the circuit blocks 20-1 to 20-4.

FIG. 3 is a perspective view of this configuration. FIG. 3 is a perspective view illustrating the configuration of the structure 30. The structure 30 has a first portion 31 and a second portion 32. The first portion 31 has a compound structure of a plurality of plate-shaped portions, specifically, has a structure in which substantially rectangular tubular members are disposed in a matrix and integrated with their side surfaces coupled to each other. The second portion 32 extends in the planar direction (XY direction) from the first portion 31 above the substrate 2 (refer to FIG. 2B). That is, the second portion 32 extends in a rectangular form in the X and Y directions so as to follow the inner surface while protruding in the X and Y directions with respect to the inner surface at a position slightly lower than a center of the inner surface of each rectangular tubular member in the first portion 31 in the Z direction. At the same time, the second portion 32 extends in a rectangular form in the XY direction so as to surround the outer surface while protruding in the XY direction with respect to the outer surface at a position slightly lower than a center of the outer surface of the first portion 31 in the Z direction. Due to the structure of the second portion 32, it is possible to easily improve the rigidity of the first portion 31.

When viewed in an XY plane, the first portion 31 illustrated by a solid line in FIG. 1B extends in a lattice pattern to form a plurality of rectangular matrix arrays, and the second portion 32 indicated by a dotted line in FIG. 1B extends so as to form a plurality of large- and small-size rectangles along the inner side and the outer side of the first portion 31. For example, the second portion 32, extending in contact with the outside of the first portion 31, constitutes a single large rectangle, and the second portion 32, extending in contact with the inner side of each rectangle in the matrix array of the first portion 31, constitutes a single small rectangle (in FIG. 1, a total of four small rectangles).

In addition, considering that the stress matters after the slit (separator) forming process in the process of manufacturing the semiconductor device, in a case where, in the process of manufacturing the semiconductor device, the slit for the structure 30 is formed together with the slit for the separator 40 and the structure 30 is formed together with the separator 40, the structure 30 may correspond to the separator 40 in terms of a cross-sectional structure and a material.

For example, the structure 30 may have a cross-sectional structure as illustrated in FIG. 2B. The first portion 31 of the structure 30 extends in a direction (Z direction) perpendicular to the substrate surface on the substrate 2 and has a conductive member 31a and insulating films 31b and 31c. In FIG. 2B, the interlayer insulating film 3 on the left side of the first portion 31 in the figure is referred to as an interlayer insulating film 3L for the sake of convenience, and the interlayer insulating film 3 on the right side is referred to as an interlayer insulating film 3R for the sake of convenience. The conductive member 31a has a substantially fin shape. For example, in a portion extending in the X direction, when viewed in an XY plane, the conductive member has a substantially fin shape extending in X and Z directions, and in a portion extending in the Y direction, when viewed in an XY plane, the conductive member has a substantially fin shape extending in the Y and Z directions. The conductive member 31a may be made of a material containing a conductive material (for example, tungsten) as a main component. A side surface 31a1 of the conductive member 31a facing the interlayer insulating film 3L is covered with the insulating film 31b having a substantially fin shape extending along the first portion 31. A side surface 31a2 of the conductive member 31a facing the interlayer insulating film 3R is covered with the insulating film 31c having a substantially fin shape extending along the first portion 31. Each of the insulating film 31b and the insulating film 31c may be made of a material containing an insulator (for example, a silicon oxide) as a main component. As mentioned above, when the block film is deposited in the gap formed by removing the sacrificial film in the formation of each stacked body 10, the residue (for example, a film containing alumina as a main component) of the block film deposited also on the side surface of the slit may be also deposited on the outer surfaces of the insulating film 31b and the insulating film 31c.

The first portion 31 extends to the substrate 2 from a position above (in +Z side) the upper surface of the stacked body 10 in the Z direction. The substrate 2 further includes a guard ring region 25 in addition to the underlying region 21, the first well region 22, and the second well region 23. The first portion 31 can extend to the guard ring region 25 in the substrate 2. The guard ring region 25 has a groove 25a corresponding to the first portion 31. With this structure, the lower part of the first portion 31 may be supported by the groove 25a. It is thus possible to easily improve the rigidity of the first portion 31.

The guard ring region 25 is a region for forming a potential barrier for the first well region 22 and protecting the circuit block 20 (the circuit block 20-3 in the case of FIG. 2B) from electric noise such as electrostatic noise. When the first well region 22 contains impurities of the first conductivity, the guard ring region 25 may contain the impurities of the first conductivity at a concentration lower than the first well region 22, may be an intrinsic region containing no impurities, or may contain impurities of the second conductivity opposite to the first conductivity. When the first conductivity is N-type, the impurity of the first conductivity may be, for example, phosphorus, or arsenic. When the first conductivity is P-type, the impurity of the first conductivity may be, for example, boron.

The second portion 32 of the structure 30 extends in the planar direction (XY direction) from the first portion 31 above the substrate 2 (in the +Z side). For example, the second portion 32 illustrated in FIG. 2B includes a portion 32b extending from the insulating film 31b toward the −Y side and a portion 32c extending from the insulating film 31c toward the +Y side. The second portion 32 (each of the portions 32b and 32c) may be made of a material containing a conductive material (for example, tungsten) as a main component. As illustrated in FIG. 2B, the second portion 32 is a film continuous with the silicon nitride film 21 disposed on the transistor in the circuit block 20-3. That is, as mentioned above, the second portion 32 is a conductive film formed by burying a conductive material in a gap via the slit for the structure 30 when the conductive material is buried in the gap via the slit for the separator 40 to form the conductive film.

In addition, the electrical connection between the memory cell array region MAR and the peripheral circuit region PCR can be performed via the upper layer interconnection 41 illustrated in FIGS. 2A and 2B. The upper layer interconnection 41 in the peripheral circuit region PCR may extend in either the X direction or the Y direction at a position closer to the +Z side than a +Z side end of the structure 30 (FIG. 2B extending in the Y direction). In FIGS. 2A and 2B, the upper layer interconnection 41 is exemplified as a single conductive film, but the upper layer interconnection 41 may include a plurality of conductive films and a plurality of plugs. In addition, as illustrated in FIG. 2B, since signals can be transmitted and received to and from each circuit block 20 via a plug PL2, a conductive film CF, a plug PL3, and the upper layer interconnection 41, the structure 30 can surround the circuit block 20 without problem.

As illustrated in FIGS. 1A to 3, the structure 30 extends between the plurality of circuit blocks 20-1 to 20-4 and can divide the interlayer insulating film 3 disposed in the peripheral circuit region PCR into a plurality of regions. Accordingly, as illustrated by outlined arrows in FIG. 4, the stress caused by expansion of each of the plurality of regions in the interlayer insulating film 3 of the peripheral circuit region PCR can be alleviated to a small extent. FIG. 4 is a plan view illustrating stress distribution in the semiconductor device.

In addition, the structure 30 can function as a barrier wall against the stress from the interlayer insulating film 3 toward the stacked body 10 (refer to the dotted line arrow in FIG. 2B), and the stress toward the stacked body 10 can be effectively alleviated. Accordingly, it is possible to reduce the occurrence of electrical disconnection and short-circuiting in the stacked body 10, and thus, it is possible to improve the yield of the semiconductor device 1 in the manufacturing and to reduce the malfunction of the semiconductor device 1 after the manufacturing.

As described above, in the embodiment, in the semiconductor device 1, the structure 30 extending between the plurality of circuit blocks 20-1 to 20-4 in the peripheral circuit region PCR including the plurality of circuit blocks 20-1 to 20-4 is provided. Accordingly, since the stress exerted from the interlayer insulating film 3 to the stacked body 10 can be reduced, it is possible to improve the yield of the semiconductor device 1 in the manufacturing and to reduce the malfunction of the semiconductor device 1 after the manufacturing.

Figure 5B:
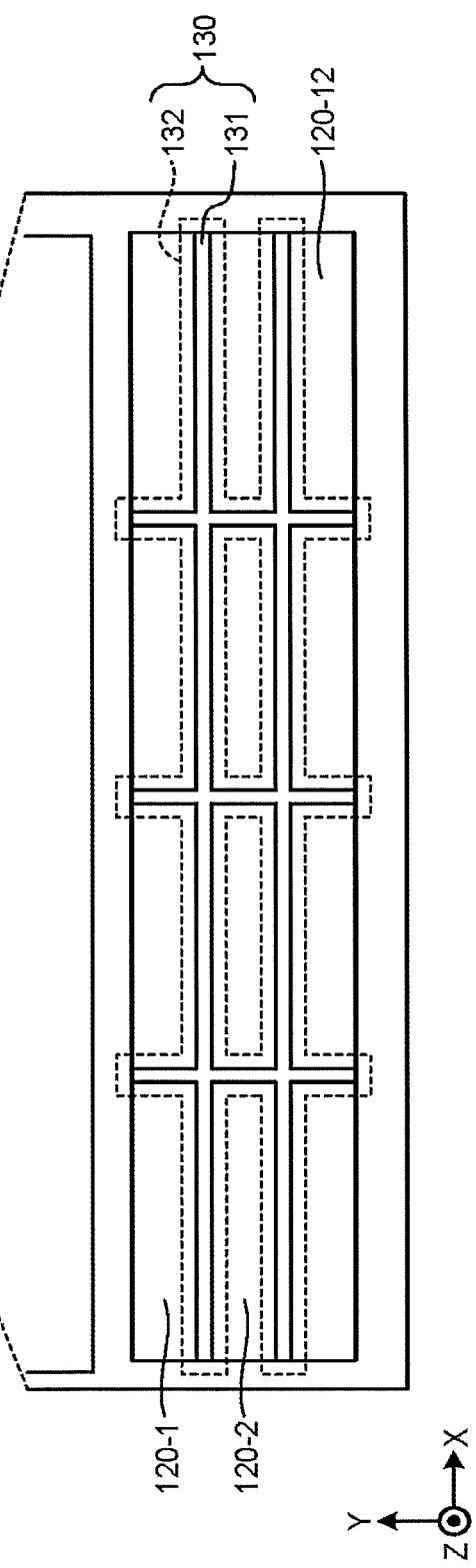

In addition, as Modified Example of the embodiment, as illustrated in FIGS. 5A and 5B, when viewed in an XY plane, the structure 130 in the semiconductor device 100 may extend between the plurality of circuit blocks 120-1 to 120-12 without surrounding the outside of the plurality of circuit blocks 120-1 to 120-12. FIG. 5A is a plan view illustrating a configuration of the semiconductor device 100, and FIG. 5B is a plan view illustrating a configuration of the peripheral circuit region and is an enlarged plan view of a portion D in FIG. 5A.

As illustrated in FIG. 5B, a plurality of circuit blocks 120-1 to 120-12 and a structure 130 are disposed in the peripheral circuit region PCR. The plurality of circuit blocks 120-1 to 120-12 are disposed in a matrix when viewed in an XY plane. The structure 130 extends between the plurality of circuit blocks 120-1 to 120-12. The structure 130 extends between the plurality of circuit blocks 120-1 to 120-12 in a lattice pattern when viewed in an XY plane.

Figure 6:
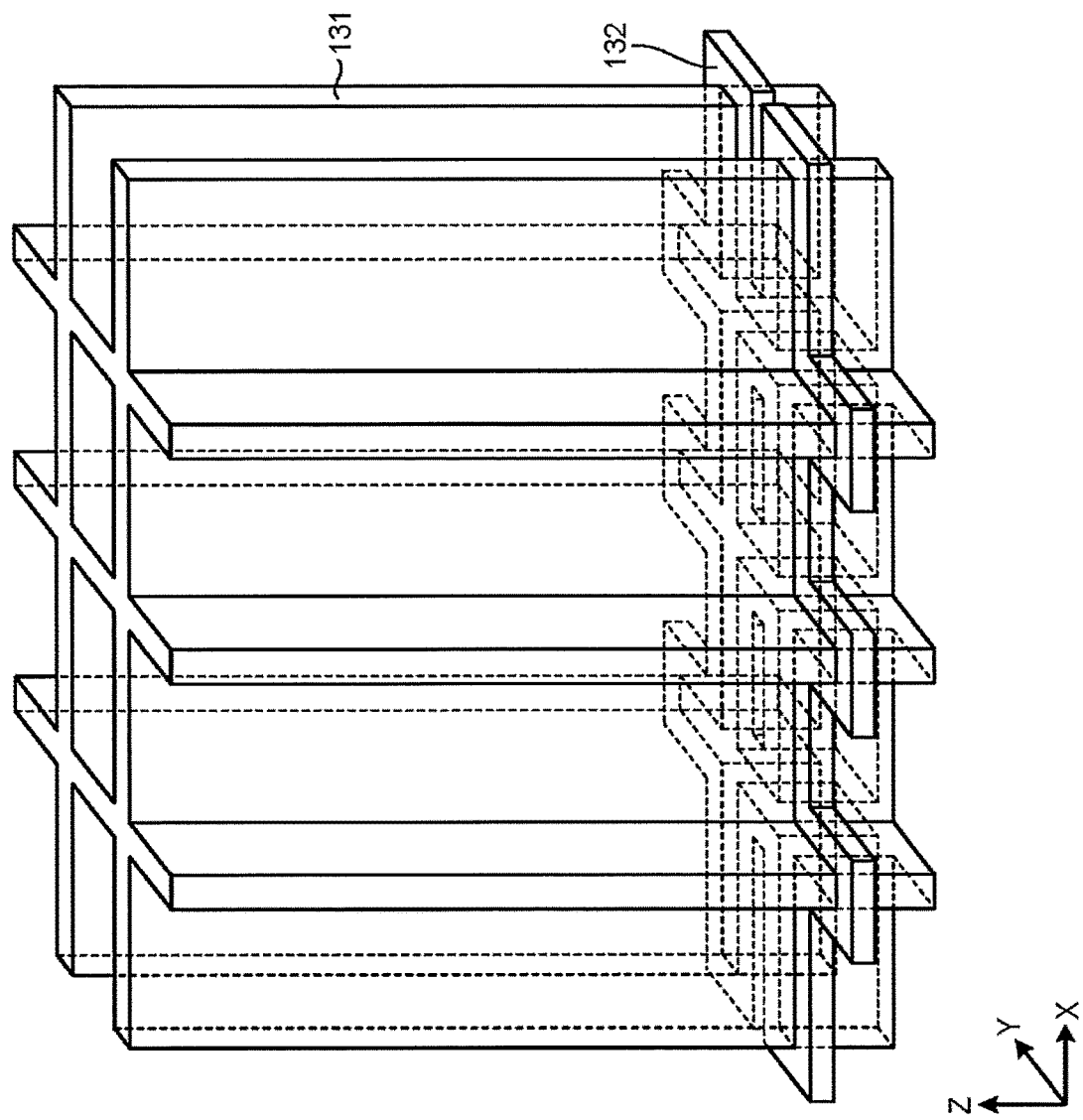
FIG. 6 is a perspective view illustrating a configuration of a structure in Modified Example of the embodiment.

This configuration is illustrated in a perspective view in FIG. 6. FIG. 6 is a perspective view illustrating the configuration of the structure 130. The structure 130 includes a first portion 131 and a second portion 132. The first portion 131 has a structure in which a plurality of plate members extending in the YZ direction are arranged at a predetermined pitch in the X direction and a plurality of plate members extending in the XZ direction are arranged at a predetermined pitch in the Y direction so as to intersect the plate members in the YZ direction. The second portion 132 extends in the planar direction (XY direction) from the first portion 131 above the substrate 2 (refer to FIG. 2B). That is, the second portion 132 extends in a lattice pattern in the XY direction so as to follow the inner and outer surfaces while protruding in the XY direction with respect to the inner and outer surfaces at a position slightly lower than centers of the inner and outer surfaces of each rectangular tubular member in the first portion 131 in the Z direction. Due to the structure of the second portion 132, it is possible to easily improve the rigidity of the first portion 131.

When viewed in an XY plane, the first portion 131 illustrated by a solid line in FIG. 5B extends in a lattice pattern to form a lattice-patterned array, and the second portion 132 indicated by a dotted line in FIG. 5B extends along the inner side and the outer side of the lattice-patterned array of the first portion 131

In addition, the cross-sectional structure of the structure 130 is similar to that of the embodiment in that the structure may have a cross-sectional structure as illustrated in FIG. 2B.

Figure 7:
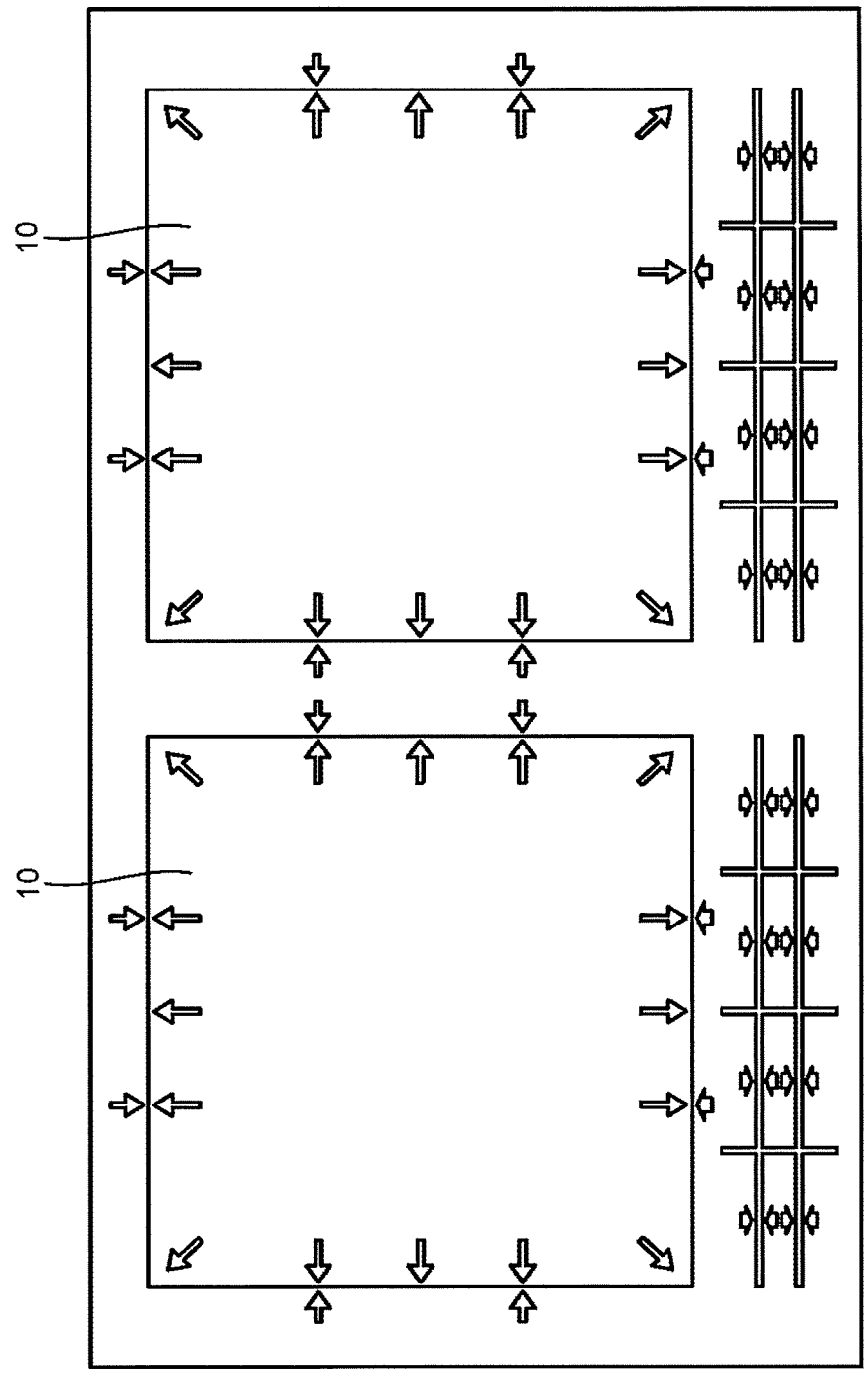
FIG. 7 is a plan view illustrating stress distribution in the semiconductor device according to Modified Example of the embodiment.

As illustrated in FIGS. 5A, 5B, and 6, the structure 130 extends between the plurality of circuit blocks 120-1 to 120-12 and can divide the interlayer insulating film 3 disposed in the peripheral circuit region PCR into a plurality regions. Accordingly, as illustrated by outlined arrows in FIG. 7, the stress itself generated by expansion of each of the plurality of regions in the interlayer insulating film 3 of the peripheral circuit region PCR can be alleviated to a small extent. FIG. 7 is a plan view illustrating stress distribution in the semiconductor device. In addition, the structure 130 can function as a barrier wall against the stress from the interlayer insulating film 3 toward the stacked body 10 (refer to a dotted line arrow in FIG. 2B), and the stress toward the stacked body 10 can be effectively alleviated. Accordingly, it is possible to suppress electrical disconnection and short-circuiting in the stacked body 10, and thus, it is possible to improve the yield of the semiconductor device 100 in the manufacturing and to reduce the malfunction of the semiconductor device 100 after the manufacturing.

In this manner, in Modified Example of the embodiment, in the semiconductor device 100, the structure 130 extending between the plurality of circuit blocks 120-1 to 120-12 is provided. Accordingly, since the stress exerted from the interlayer insulating film 3 toward the stacked body 10 can be reduced, it is possible to improve the yield of the semiconductor device 100 in the manufacturing and to reduce the malfunction of the semiconductor device 100 after the manufacturing.

Figure 8:
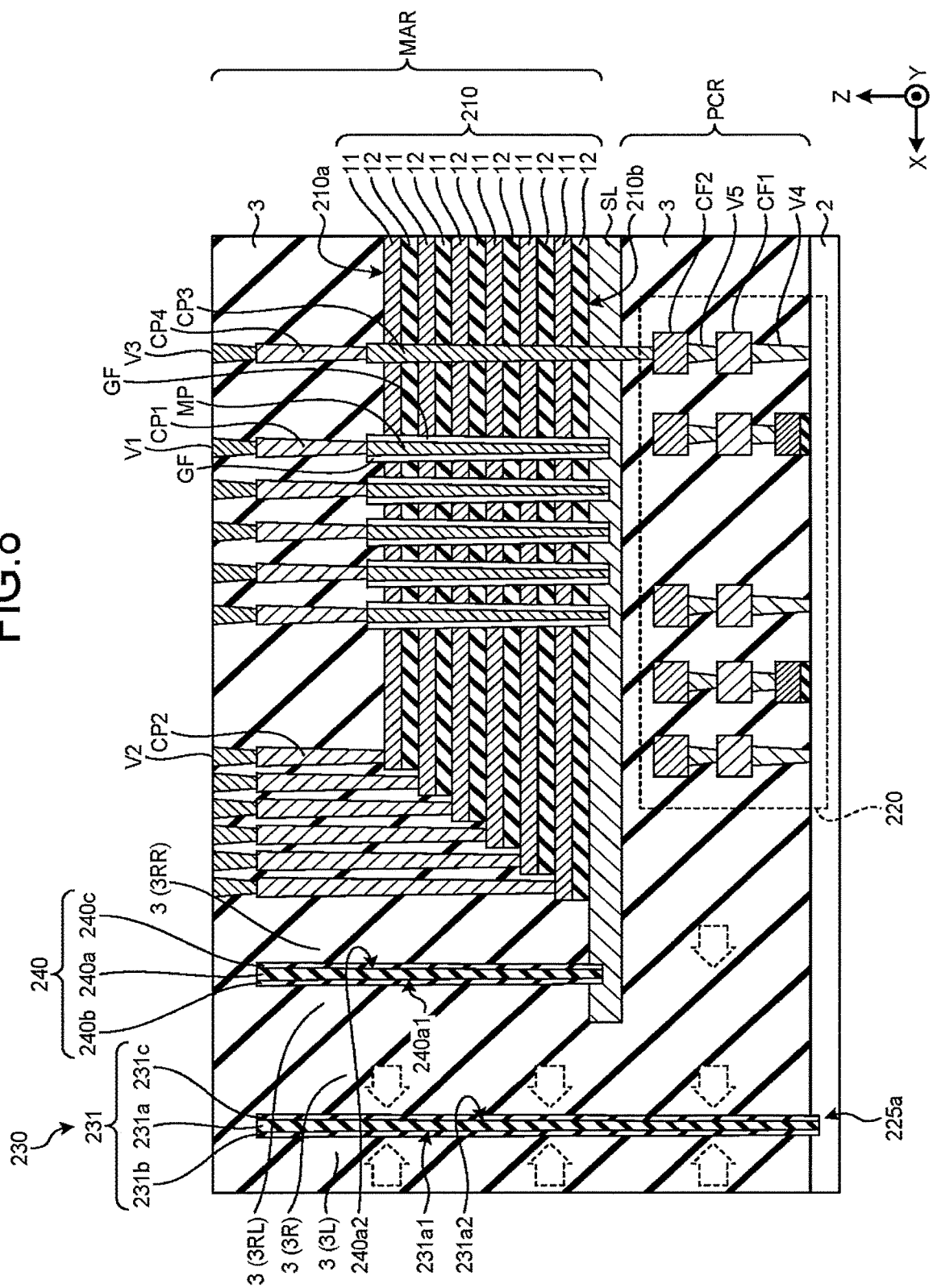
FIG. 8 is a cross-sectional view illustrating a configuration of a semiconductor device according to another Modified Example of the embodiment.

Alternatively, as illustrated in FIG. 8, a peripheral circuit region PCR may be provided below the memory cell array region MAR (in the −Z side) in order to achieve higher integration of the semiconductor device. In this case, a structure 230 may be disposed in the vicinity of a plurality of circuit blocks 220 in the peripheral circuit region PCR.

For example, in the process of manufacturing the semiconductor device, the slit for the structure 230 is formed together with the slit for a separator 240. The slit for the separator 240 extends to the conductive layer SL above (in the +Z side) the substrate 2, whereas the slit for the structure 230 extends to the substrate 2. The block film, deposited in the gap formed by removing the sacrificial film in the formation of a stacked body 210, is removed in each slit. While a residue (for example, a film containing alumina as a main component) of the block film remains on the side surface of each slit, an insulating material is filled in each slit to thereby form the structure 230 and the separator 240.

In this case, a first portion 231 of the structure 230 has a plate-shaped structure in which the first portion 231 extends to the substrate 2 from a position (a position in the Z direction above the upper surface of the stacked body 210) closer to the +Z side than a +Z side end 210a of the stacked body 210. The +Z side end of the structure 230 may be located at a position closer to the +Z side than a +Z side end of a semiconductor columnar member MP. The substrate 2 has a groove 225a corresponding to the first portion 231. With this structure, the lower part of the first portion 231 may be supported by the groove 225a. Accordingly, it is possible to improve the rigidity of the first portion 231.

In addition, the separator 240 has an insulating member 240a and insulating films 240b and 240c. The interlayer insulating film 3 on the left side of the separator 240 in the figure is referred to as an interlayer insulating film 3RL for the convenience, and the interlayer insulating film 3 on the right side of the separator 240 is referred to as an interlayer insulating film 3RR for the convenience. The insulating member 240a has a substantially fin shape. For example, in a portion extending in the X direction when viewed in an XY plane, the insulating member has a substantially fin shape extending in the XZ direction, and in a portion extending in the Y direction when viewed in an XY plane, the insulating member has a substantially fin shape extending in the YZ direction. Among the insulating members, at least a portion of the substantially fin-shaped insulating member (not illustrated) extending in the X direction is disposed, for example, in the stacked body 210 at the same position as the plurality of separators 40 illustrated in FIG. 2 when viewed in a YZ cross section and electrically separates the stacked body 210 into a plurality of parts in the Y direction. The insulating member 240a may be made of a material containing an insulator (for example, a silicon oxide) as a main component. A side surface 240a1 of the insulating member 240a facing the interlayer insulating film 3RL is covered with the insulating film 240b having a substantially fin shape extending along the insulating member 240a. A side surface 240a2 of the insulating member 240a facing the interlayer insulating film 3RR is covered with the insulating film 240c having a substantially fin shape extending along the insulating member 240a. Each of the insulating film 240b and the insulating film 240c may be made of a material containing an insulator (for example, alumina) as a main component. As mentioned above, the insulating film 240b and the insulating film 240c are residues of the block film deposited on the side surface of the slit when the block film is deposited in the gap formed by removing the sacrificial film in the formation of the stacked body 210.

The first portion 231 of the structure 230 has a structure (for example, a cross-sectional structure, a material) corresponding to the separator 240 and includes an insulating member 231a and insulating films 231b and 231c. The interlayer insulating film 3 on the left side of the first portion 231 in the figure is referred to as an interlayer insulating film 3L for the convenience, and the interlayer insulating film 3 on the right side is referred to as an interlayer insulating film 3R for the convenience. The insulating member 231a has a substantially fin shape. For example, in a portion extending in the X direction, when viewed in an XY plane, the insulating member has a substantially fin shape extending in the XZ direction, and in a portion extending in the Y direction, when viewed in an XY plane, the insulating member has a substantially fin shape extending in the YZ direction. The insulating member 231a may be made of a material containing an insulator (for example, a silicon oxide) as a main component. A side surface 231a1 of the insulating member 231a facing the interlayer insulating film 3L is covered with the insulating film 231b having a substantially fin shape extending along the first portion 231. A side surface 231a2 of the insulating member 231a facing the interlayer insulating film 3R is covered with the insulating film 231c having a substantially fin shape extending along the first portion 231. Each of the insulating film 231b and the insulating film 231c may be made of a material containing an insulator (for example, alumina) as a main component. As described above, the insulating film 231b and the insulating film 231c are residues of the block film deposited also on the side surface of the slit when the block film is deposited in the gap formed by removing the sacrificial film in the formation of the stacked body 210 and may include an insulating material different from that of the insulating member 231a. In addition, the structure 230 may not include a portion corresponding to the second portion 32 in the embodiment.

In addition, the memory cell array region MAR and the peripheral circuit region PCR can be electrically connected via a penetration contact CP3 illustrated in FIG. 8. The penetration contact CP3 extends from a position closer to the +Z side than a +Z side end 210a of the stacked body 210 to a position closer to the −Z side than a −Z side end 210b of the stacked body 210 and penetrates the stacked body 210. In addition, the penetration contact CP3 penetrates the conductive layer SL below the stacked body 210 to a conductive film CF2 in the peripheral circuit region PCR. The conductive layer SL functions as a source line in the three-dimensional memory and is connected to the lower end of the semiconductor columnar member SP penetrating the stacked body 210 in the Z direction. The penetration contact CP3 is insulated from the stacked body 210 and the conductive layer SL by an insulating film (not illustrated) disposed so as to surround the penetration contact CP3 when viewed in an XY cross section. As illustrated in FIG. 8, signals are transmitted and received from the upper layer interconnection (not illustrated) to each circuit block 220 via a plug V3, a contact CP4, the penetration contact CP3, the conductive film CF2, a plug V5, a conductive film CF1, and a plug V4, the stacked body 210 can be disposed above (in the +Z side) the circuit block 220 without problem.

In addition, signals are transmitted and received from the upper layer interconnection (not illustrated) to the conductive film 11 via a plug V2 and a contact CP2, and signals are transmitted and received from the upper layer interconnection (not illustrated) as a bit line to the semiconductor columnar member MP in the three-dimensional memory via a plug V1 and a contact CP1. In addition, when viewed in an XY cross-sectional view, the semiconductor columnar member MP is surrounded by a substantially cylindrical gate insulating film GF having a charge storage capability similarly to the semiconductor columnar member SP illustrated in FIG. 2. The semiconductor columnar member MP may have a structure in which a core insulating film is disposed inside a semiconductor member.

As illustrated in FIG. 8, in the vicinity of the stacked body 210 and the circuit block 220, the structure 230 extends to the substrate 2 from a position closer to the +Z side than the +Z side end 210a of the stacked body 210. Accordingly, as indicated by a broken line arrow in FIG. 8, the structure 230 can function as a barrier wall against the stress from the interlayer insulating film 3 toward the stacked body 210 and can effectively alleviate the stress toward the stacked body 210. Accordingly, it is possible to reduce electric disconnection and short-circuiting in the stacked body 210, and thus, it is possible to improve the yield of the semiconductor device in the manufacturing and to reduce the malfunction of the semiconductor device after the manufacturing.

As described above, in a semiconductor device according to another Modified Example of the embodiment, a structure 230 extends to the substrate 2 from a position closer to the +Z side than the +Z side end 210a of the stacked body 210 in the vicinity of the stacked body 210 and the circuit block 220. In addition, the +Z side end of the structure 230 may be located at a position closer to the +Z side than a +Z side end of the semiconductor columnar member MP. This can reduce the stress from the interlayer insulating film 3 toward the stacked body 210, thereby improving the yield of the semiconductor device in the manufacturing and reducing the malfunction of the semiconductor device after the manufacturing.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A semiconductor device comprising:
   a stacked body including a conductive film and an insulating layer alternately disposed above a semiconductor substrate in a stacking direction;
   a semiconductor columnar member that penetrates the stacked body in the stacking direction;
   an insulating film that surrounds the semiconductor columnar member and penetrates the stacked body in the stacking direction; and
   a structure disposed in a peripheral circuit region on the semiconductor substrate, the structure comprising a plate-shaped portion that extends at least between a plurality of circuit blocks, the peripheral circuit region including the plurality of circuit blocks.
2. The semiconductor device according to claim 1, wherein
   the plurality of circuit blocks is disposed in a matrix on the semiconductor substrate, and
   the structure extends in a lattice pattern between the plurality of circuit blocks.
3. The semiconductor device according to claim 2, wherein
   the structure further extends so as to surround the plurality of circuit blocks.
4. The semiconductor device according to claim 1, wherein
   the structure comprises:
      a plate-shaped first portion that extends from above an upper surface of the stacked body to the semiconductor substrate in the stacking direction; and
      a second portion that extends from the first portion in a substrate surface direction above the semiconductor substrate.
5. The semiconductor device according to claim 4, wherein
   the second portion protrudes in the substrate surface direction at a position closer to the semiconductor substrate than a center of the first portion in the stacking direction.
6. The semiconductor device according to claim 4, wherein
   the first portion has a compound structure of a plurality of plate-shaped portions, and
   the second portion extends in the substrate surface direction along side surfaces of the plate-shaped portions.
7. The semiconductor device according to claim 4, wherein
   the first portion has a compound structure of a plurality of plate-shaped portions, and
   the second portion protrudes in the substrate surface direction at a position closer to the semiconductor substrate than a center of a side surface of the compound structure of the plate-shaped portions in the stacking direction.

8. The semiconductor device according to claim 4, wherein
the first portion constitutes a lattice-patterned array when viewed from a direction perpendicular to a surface of the semiconductor substrate, and
the second portion extends along the lattice-patterned array when viewed from the direction perpendicular to the surface of the semiconductor substrate.

9. The semiconductor device according to claim 4, wherein
the first portion includes a plate-shaped conductive member and an insulating film that covers a side surface of the conductive member.

10. The semiconductor device according to claim 9, further comprising
a separator disposed in the stacked body, the separator extending in a first direction intersecting the stacking direction and dividing the stacked body into blocks in a second direction intersecting the first direction,
wherein a material of the first portion corresponds to a material of the separator.

11. The semiconductor device according to claim 4, wherein
the second portion is made of a material containing a conductive material as a main component.

12. The semiconductor device according to claim 4, wherein
the first portion has a structure including a plurality of first plate members and a plurality of second plate members, the first plate members extending in the stacking direction and in a first direction, the first plate members being arranged at a predetermined pitch in a second direction, the second plate members extending in the stacking direction and in the second direction, the second plate members being arranged at a predetermined pitch in the first direction so as to intersect with the first plate members, the first direction intersecting the stacking direction, the second direction intersecting the first direction and the stacking direction,
the first plate members and the second plate members constitute a lattice-patterned array when viewed from a direction perpendicular to a surface of the semiconductor substrate, and
the second portion extends in a lattice pattern along an inner side of the lattice-patterned array when viewed from the direction perpendicular to the surface of the semiconductor substrate.

13. The semiconductor device according to claim 4, wherein
the first portion has a structure including a plurality of first plate members and a plurality of second plate members, the first plate members extending in the stacking direction and in a first direction, the first plate members being arranged at a predetermined pitch in a second direction, the second plate members extending in the stacking direction and in the second direction, the second plate members being arranged at a predetermined pitch in the first direction so as to intersect with the first plate members, the first direction intersecting the stacking direction, the second direction intersecting the first direction and the stacking direction,
the first plate members and the second plate members constitute a lattice-patterned array when viewed from a direction perpendicular to a surface of the semiconductor substrate, and
the second portion extends in a lattice pattern along an outer side of the lattice-patterned array when viewed from the direction perpendicular to the surface of the semiconductor substrate.

14. The semiconductor device according to claim 4, wherein
the first portion has a structure including a plurality of first plate members and a plurality of second plate members, the first plate members extending in the stacking direction and in a first direction, the first plate members being arranged at a predetermined pitch in a second direction, the second plate members extending in the stacking direction and in the second direction, the second plate members being arranged at a predetermined pitch in the first direction so as to intersect with the first plate members, the first direction intersecting the stacking direction, the second direction intersecting the first direction and the stacking direction, and
the second portion protrudes in the substrate surface direction at a position closer to the semiconductor substrate than a center of side surfaces of the first plate members in the stacking direction and protrudes in the substrate surface direction at a position closer to the semiconductor substrate than a center of side surfaces of the second plate members in the stacking direction.

15. The semiconductor device according to claim 4, wherein
the semiconductor substrate includes, on a surface of the semiconductor substrate, a groove structure corresponding to the plate-shaped first portion.

16. The semiconductor device according to claim 15, wherein
the semiconductor substrate comprises a guard ring region that includes, on a surface of the guard ring region, the groove structure.

17. A semiconductor device comprising:
a stacked body disposed above a peripheral circuit region on a semiconductor substrate, the stacked body including a conductive film and an insulating layer alternately disposed in a stacking direction;
a semiconductor columnar member that penetrates the stacked body in the stacking direction;
an insulating film that surrounds the semiconductor columnar member and penetrates the stacked body in the stacking direction; and
a structure including a plate-shaped portion disposed in a vicinity of the stacked body and the peripheral circuit region, the plate-shaped portion extending from above an upper surface of the stacked body to the semiconductor substrate in the stacking direction.

18. The semiconductor device according to claim 17, wherein
the structure includes
an insulating member extending in a first direction intersecting the stacking direction and an insulating film, on a side surface of the insulating member, containing an insulating material different from that of the insulating member.

19. The semiconductor device according to claim 17, wherein
the semiconductor substrate includes, on a surface of the semiconductor substrate, a groove structure corresponding to the plate-shaped portion.

20. The semiconductor device according to claim 17, wherein an upper end of the structure is located above an upper end of the semiconductor columnar member.

\* \* \* \* \*